(12) United States Patent
Fukagawa et al.

(10) Patent No.: US 10,644,192 B2
(45) Date of Patent: May 5, 2020

(54) METHOD OF MANUFACTURING LIGHT-EMITTING DEVICE

(71) Applicant: TOYODA GOSEI CO., LTD., Kiyosu-shi (JP)

(72) Inventors: Koji Fukagawa, Kiyosu (JP); Takashi Terayama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 348 days.

(21) Appl. No.: 15/195,736

(22) Filed: Jun. 28, 2016

(65) Prior Publication Data

US 2017/0018678 A1  Jan. 19, 2017

(30) Foreign Application Priority Data

Jul. 13, 2015 (JP) ................. 2015-140007
Apr. 8, 2016 (JP) ................. 2016-078239

(51) Int. Cl.
*H01L 33/00* (2010.01)

(52) U.S. Cl.
CPC .. *H01L 33/0095* (2013.01); *H01L 2933/0041* (2013.01)

(58) Field of Classification Search
CPC .................................................. H01L 33/0095
See application file for complete search history.

(56) References Cited

U.S. PATENT DOCUMENTS

| | | | |
|---|---|---|---|
| 6,335,548 B1* | 1/2002 | Roberts | H01L 23/49562 250/239 |
| 2008/0054279 A1* | 3/2008 | Hussell | H01L 33/54 257/95 |
| 2010/0052006 A1* | 3/2010 | Takeda | H01L 33/508 257/100 |
| 2013/0105850 A1* | 5/2013 | Komatsu | H01L 33/505 257/98 |
| 2016/0149089 A1* | 5/2016 | Yamaguchi | H01L 33/504 257/98 |

FOREIGN PATENT DOCUMENTS

| | | |
|---|---|---|
| JP | 2004-186488 A | 7/2004 |
| JP | 2007-227791 A | 9/2007 |
| JP | 2008-103688 A | 5/2008 |
| JP | 2010-062286 A | 3/2010 |
| JP | 2012-039000 A | 2/2012 |

OTHER PUBLICATIONS

Japanese Office Action, dated Apr. 2, 2019, in Japanese Application No. 2016-078239 and English Translation thereof.

* cited by examiner

*Primary Examiner* — Kimberly N Rizkallah
*Assistant Examiner* — Alexander Belousov
(74) *Attorney, Agent, or Firm* — McGinn I. P. Law Group, PLLC.

(57) ABSTRACT

A method of manufacturing a light-emitting device includes measuring a light distribution of a light-emitting element, sealing the measured light-emitting element by a sealing material including a phosphor, and curing the sealing material by heat treatment. An emission angle dependence of emission chromaticity of the light-emitting device is controlled by setting a degree of settling of the phosphor in the sealing material according to the measured light distribution of the light-emitting element.

6 Claims, 7 Drawing Sheets

METHOD OF MANUFACTURING LIGHT-EMITTING DEVICE

The present application is based on Japanese patent application Nos. 2015-140007 and 2016-078239 filed on Jul. 13, 2015 and Apr. 8, 2016, respectively, the entire contents of which are incorporated herein by reference.

BACKGROUND OF THE INVENTION

1. Field of the Invention

The invention relates to a method of manufacturing a light-emitting device.

2. Description of the Related Art

A light-emitting device is known in which the shape of a sealing material which contains phosphor and seals a light-emitting element is controlled so as to prevent unevenness in emission color (see e.g. JP-A-2012-39000 and JP-A-2010-62286).

The light-emitting device disclosed in JP-A-2012-39000 is configured such that the shape of the sealing material is controlled so as to match the light distribution of the light-emitting element to the light distribution of the phosphor to prevent the unevenness.

The light-emitting device disclosed in JP-A-2010-62286 is configured such that the sealing material is thick where the light emission intensity of the light-emitting element is high and thin where the light emission intensity of the light-emitting element is low, thereby preventing the unevenness.

SUMMARY OF THE INVENTION

It is an object of the invention to provide a method of manufacturing a light-emitting device that allows the emission angle dependence of emission chromaticity to be controlled in a wire range.

(1) According to an embodiment of the invention, a method of manufacturing a light-emitting device comprises:

measuring a light distribution of a light-emitting element; sealing the measured light-emitting element by a sealing material including a phosphor; and curing the sealing material by heat treatment, wherein an emission angle dependence of emission chromaticity of the light-emitting device is controlled by setting a degree of settling of the phosphor in the sealing material according to the measured light distribution of the light-emitting element.

In the above embodiment (1) of the invention, the following modifications and changes can be made.

(i) The degree of settling of the phosphor is controlled by adjusting a dispersant concentration in the sealing material.

(ii) The degree of settling of the phosphor is controlled by changing the conditions of the heat treatment.

(iii) The phosphor comprises a plurality of types of phosphors.

Effects of the Invention

According to an embodiment of the invention, a method of manufacturing a light-emitting device can be provided that allows the emission angle dependence of emission chromaticity to be controlled in a wire range. Thus, it is possible to control the emission angle dependence of emission chromaticity of the light-emitting device in a wide range by measuring the light distribution of the light-emitting element before sealing the light-emitting element by the sealing material and then setting the degree of settling of the phosphor in the sealing material according to the measured light distribution of the light-emitting element.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

Configuration of Light-Emitting Device

Figure 1A:
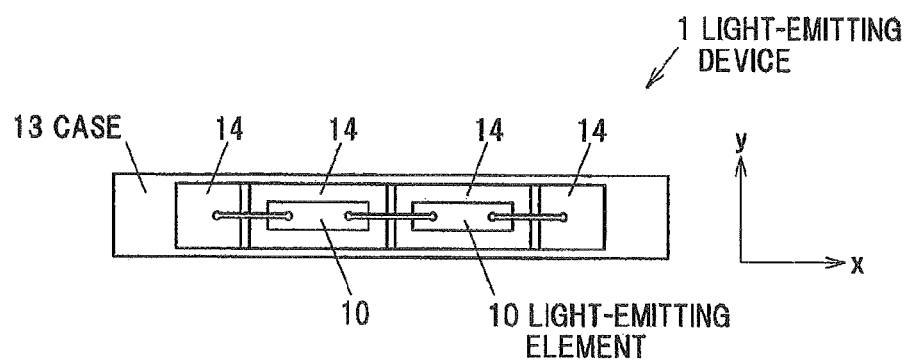
FIG. 1A is a top view showing a light-emitting device in a first embodiment.
Figure 1B:
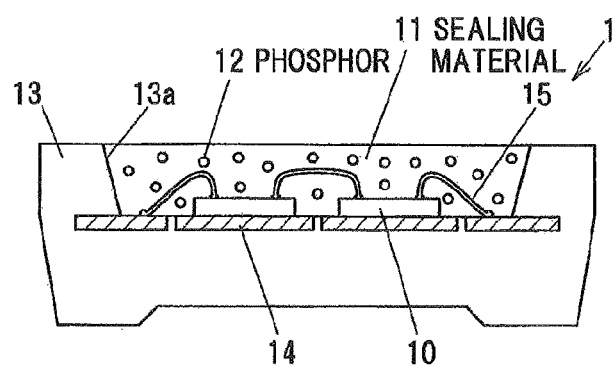
FIG. 1B is a vertical cross sectional view showing the light-emitting device taken along an x-direction.

FIG. 1A is a top view showing a light-emitting device 1 in the first embodiment. The longitudinal direction of the planar shape of the light-emitting device 1 is defined as the x-direction and the lateral direction as the y-direction, as shown in FIG. 1A. FIG. 1B is a vertical cross sectional view showing the light-emitting device 1 taken along the x-direction.

The light-emitting device 1 has a case 13 having a recessed portion 13a, a base 14 housed in the case 13 so that an upper surface is exposed on the bottom of the recessed portion 13a, light-emitting elements 10 mounted on the base 14, a sealing material 11 filled in the recessed portion 13a to seal the light-emitting elements 10, and particulate phosphor 12 contained in the sealing material 11. In FIG. 1A, illustrations of the sealing material 11 and the phosphor 12 are omitted.

The case 13 is formed of, e.g., a thermoplastic resin such as polyphthalamide resin, LCP (Liquid Crystal Polymer) or PCT (Polycyclohexylene-dimethylene Terephthalate), or a thermosetting resin such as silicone resin, modified silicone resin, epoxy resin or modified epoxy resin. The case 13 may contain light-reflecting particles of titanium dioxide, etc., to improve light reflectance.

The entire base 14 or the surface thereof is formed of a conductive material such as Ag, Cu or Al. The base 14 may be e.g. a lead frame integrally formed with the case 13 by insert molding etc.

The light-emitting element 10 may be e.g. an LED or a laser diode etc. which has a chip substrate and a crystal layer including cladding layers and an emitting layer sandwiched therebetween. In the example shown in FIGS. 1A and 1B, the light-emitting element 10 is a face-up type element which is connected to the base 14 via bonding wires 15. However, the light-emitting element 10 may be a face-down type element with the crystal layer facing downward, or may be connected to the base 14 via a member other than bonding wires, e.g. via conductive bumps.

In addition, although two light-emitting elements 10 are provided in the light-emitting device 1 of the example shown in FIGS. 1A and 1B, the number of the light-emitting elements 10 provided in the light-emitting device 1 is not limited to a specific number.

The sealing material 11 is formed of a transparent resin such as silicone-based resin or epoxy-based resin. In detail, the sealing material 11 is formed of, e.g., a methyl silicone, a phenyl silicone or an organically modified silicone, and is particularly preferably formed of the organically modified silicone.

Since viscosity of the organically modified silicone is low, viscosity of the sealing material 11 is easily controlled by adjusting the amount of a dispersant to be added and it is thereby possible to easily control the degree of settling of the phosphor 12 in the sealing material 11. For example, particles of silica ($SiO_2$) such as AEROSIL (trademark) are used as the dispersant in the sealing material 11. To increase the degree of settling of the phosphor 12, the dispersant is not added to the sealing material 11.

The fluorescence color of the phosphor 12 is not specifically limit. For example, a BOS (barium orthosilicate) phosphor or a YAG (yttrium aluminum garnet) phosphor is used as a yellow phosphor. For example, when emission color of the light-emitting element 10 is blue and fluorescence color of the phosphor 12 is yellow, emission color of the light-emitting device 1 is white.

Figure 2:
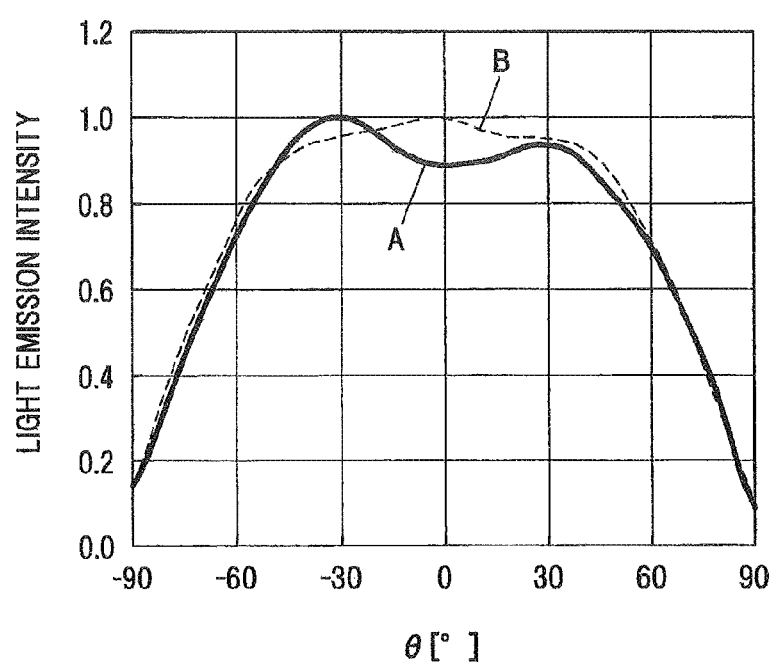
FIG. 2 is a graph showing a relation between an emission angle θ along a y-direction and emission intensity of light from a light-emitting element.

FIG. 2 is a graph showing a relation between an emission angle θ along a y-direction and emission intensity of light from the light-emitting element 10. The vertical axis in FIG. 2 indicates the value when the maximum light emission intensity is defined as 1.

Figure 3:
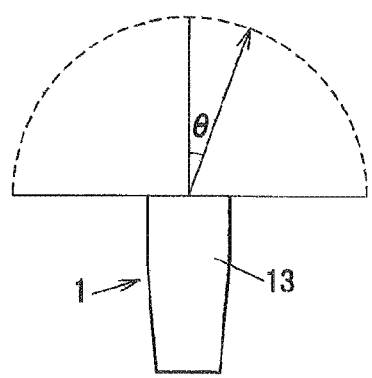
FIG. 3 is a side view of the light-emitting device as viewed in the x-direction, visualizing the emission angle θ shown in FIG. 2.

FIG. 3 is a side view of the light-emitting device 1 as viewed in the x-direction, visualizing the emission angle θ shown in FIG. 2. As shown in FIG. 3, the emission angle θ is an angle relative to the vertical direction.

FIG. 2 shows the results of measuring the light distribution of one LED chip of the LED chip group A and from one LED chip of the LED chip group B. As shown in FIG. 2, the distribution of light is narrower (i.e., the emission angle dependence of light emission intensity being larger) for the LED chip group A than for the LED chip group B. This shows that there is a difference in a relation between the emission angle θ and light emission intensity between individual light-emitting elements 10.

Figure 4A:
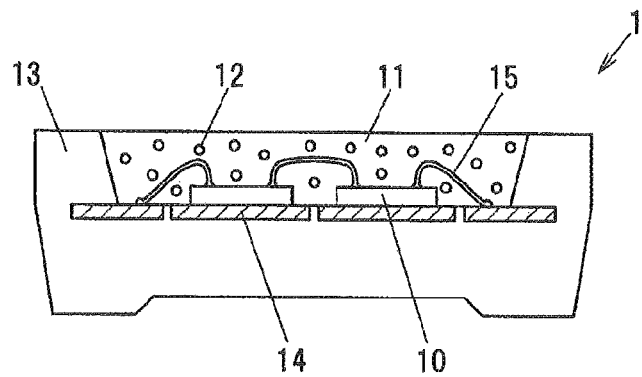
FIGS. 4A to 4C are vertical cross sectional views showing three types of light-emitting devices which have different degrees of settling of phosphor.
Figure 4B:
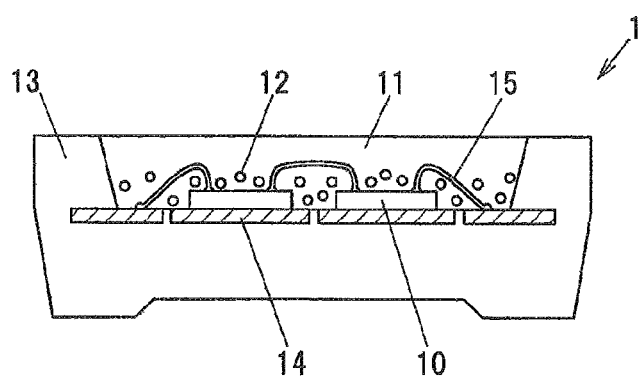
Figure 4C:
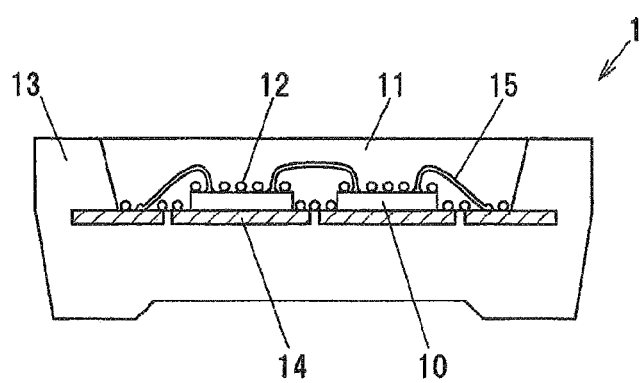

FIGS. 4A to 4C are vertical cross sectional views showing three types of light-emitting devices 1 which have different degrees of settling of the phosphor 12.

FIG. 4A shows the state in which the phosphor 12 is widely dispersed in the sealing material 11 and has a relatively small degree of settling of the phosphor 12. FIG. 4C shows the state in which the phosphor 12 substantially completely settles at the bottom of the recessed portion 13a of the case 13 and has a relatively large degree of settling of the phosphor 12. FIG. 4B shows the state in which the degree of settling of the phosphor 12 is between FIG. 4A and FIG. 4C.

The larger the degree of settling of the phosphor 12 is, the smaller the thickness of a layer containing the phosphor 12 in the sealing material 11 is and the smaller the difference in optical path of light passing through the layer containing the phosphor 12 is. Thus, the emission angle dependence of emission chromaticity of the light-emitting device 1 decreases with increase in the degree of settling of the phosphor 12. By contrast, the smaller the degree of settling of the phosphor 12 is, the larger the thickness of a layer containing the phosphor 12 in the sealing material 11 is and the larger the difference in optical path of light passing through the layer containing the phosphor 12 is. Thus, the emission angle dependence of emission chromaticity of the light-emitting device 1 increases with decrease in the degree of settling of the phosphor 12.

As shown in FIG. 2, there is variation in the distribution of light (the emission angle dependence of light emission intensity) from the light-emitting element 10. When the degree of settling of the phosphor 12 in the sealing material 11 is constant, a difference in intensity between lights of different chromaticity increases with narrowing in the light distribution of the light-emitting element 10 and the emission angle dependence of emission chromaticity of the light-emitting device 1 thus decreases. By contrast, a difference in intensity between lights of different chromaticity decreases with widening in the light distribution of the light-emitting element 10 (with decreasing the emission angle dependence of light emission intensity) and the emission angle dependence of emission chromaticity of the light-emitting device 1 thus increases.

As such, the emission angle dependence of emission chromaticity of the light-emitting device 1 varies depending on the two conditions; the light distribution of the light-emitting element 10 and the degree of settling of the phosphor 12 in the sealing material 11. Thus, it is possible to control the emission angle dependence of emission chromaticity of the light-emitting device 1 in a wide range by measuring the light distribution of the light-emitting element 10 before sealing the light-emitting element 10 with the sealing material 11 and then setting the degree of settling of the phosphor 12 in the sealing material 11 according to the measured light distribution of the light-emitting element 10.

The degree of settling of the phosphor 12 in the sealing material 11 can be controlled by adjusting the dispersant concentration in the sealing material 11 or by changing the conditions of heat treatment performed to cure the sealing material 11, such as heating temperature or heating time. These methods can be used in combination. In detail, the degree of settling of the phosphor 12 is decreased by, e.g., increasing the dispersant concentration in the sealing material 11. Alternatively, the cure rate of the sealing material 11 is increased by increasing the heating temperature or increasing the duration of heating time, thereby decreasing the degree of settling of the phosphor 12.

Figure 5A:
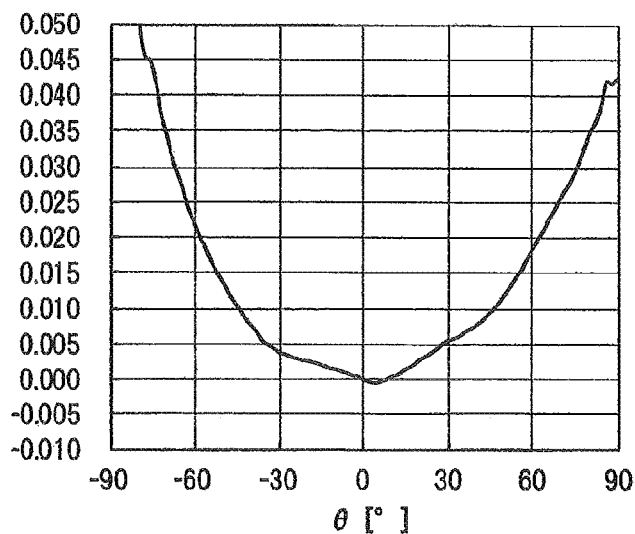
FIGS. 5A to 5C are graphs showing a relation between emission chromaticity Cy and the emission angle θ along the y-direction of the light-emitting devices when an LED chip group A providing a relatively narrow distribution of light as shown in FIG. 2 is used as the light-emitting elements and the degree of settling of phosphor is changed as shown in FIGS. 4A to 4C.
Figure 5B:
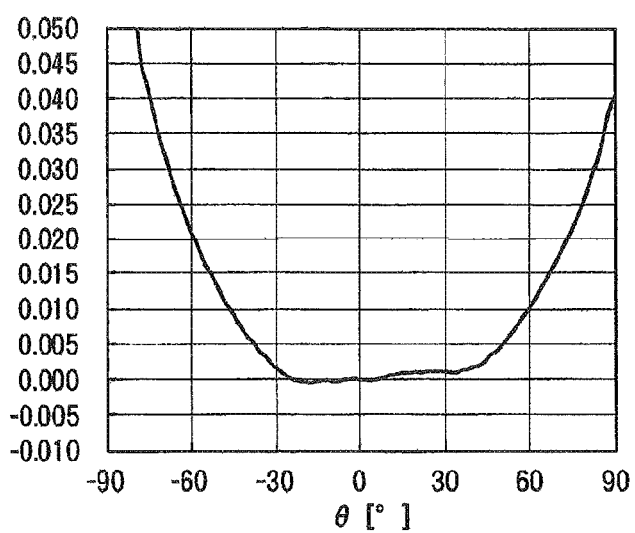
Figure 5C:
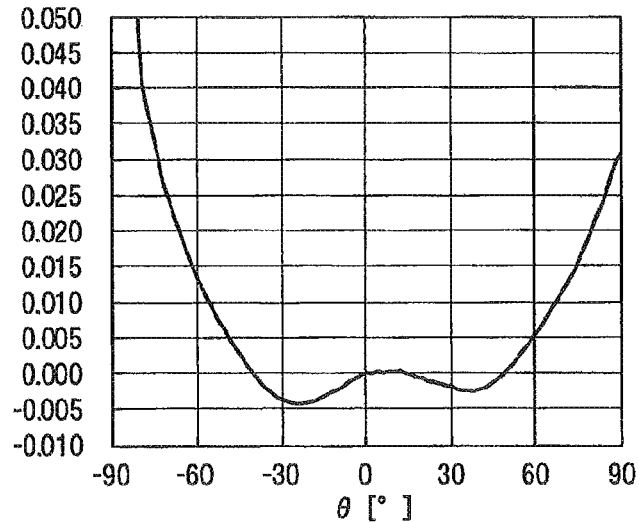

FIGS. 5A to 5C are graphs showing a relation between emission chromaticity Cy and the emission angle θ along the y-direction of the light-emitting devices 1 when the LED chip group A providing a relatively narrow distribution of light as shown in FIG. 2 is used as the light-emitting elements 10 and the degree of settling of the phosphor 12 is changed as shown in FIGS. 4A to 4C.

The degree of settling of the phosphor 12 increases in the sequence of FIG. 5A, FIG. 5B and FIG. 5C, and the emission angle dependence of the emission chromaticity Cy thus decreases in this sequence. For example, the average of the emission chromaticity Cy at the emission angle θ of +60° and the emission chromaticity Cy at −60° is 0.0207 for the light-emitting device 1 of FIG. 5A, 0.0150 for that of FIG. 5B, and 0.0095 for that of FIG. 5C.

Figure 6A:
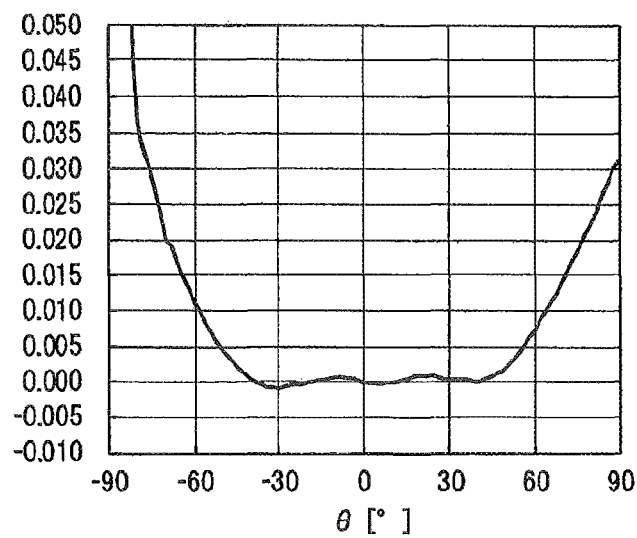
FIGS. 6A to 6C are graphs showing a relation between emission chromaticity Cy and the emission angle θ along the y-direction of the light-emitting devices when an LED chip group B providing a relatively wide distribution of light as shown in FIG. 2 is used as the light-emitting elements and the degree of settling of phosphor is changed as shown in FIGS. 4A to 4C.
Figure 6B:
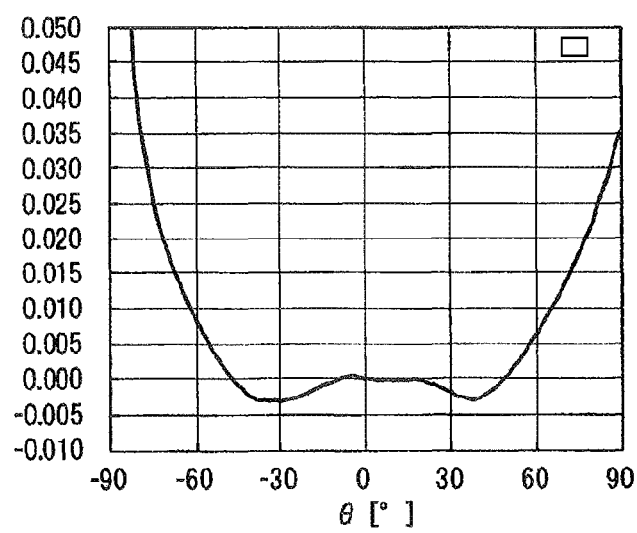
Figure 6C:
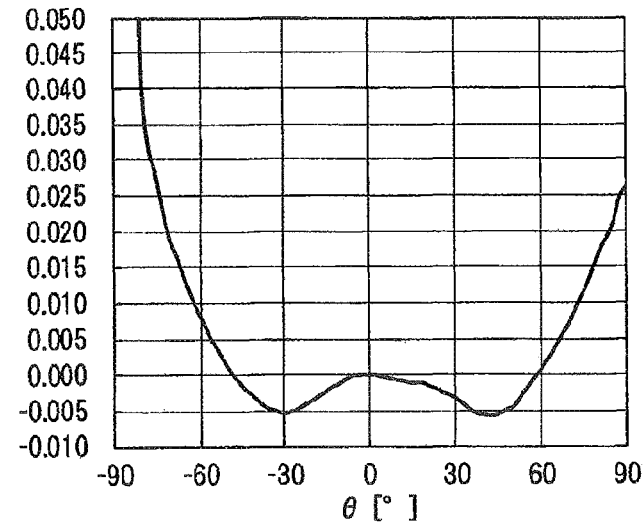

FIGS. 6A to 6C are graphs showing a relation between emission chromaticity and the emission angle θ along the y-direction of the light-emitting devices 1 when the LED chip group B providing a relatively wide distribution of light as shown in FIG. 2 is used as the light-emitting elements 10 and the degree of settling of the phosphor 12 is changed as shown in FIGS. 4A to 4C.

The degree of settling of the phosphor 12 increases in the sequence of FIG. 6A, FIG. 6B and FIG. 6C, and the emission angle dependence of the emission chromaticity Cy thus decreases in this sequence. For example, the average of the emission chromaticity Cy at the emission angle θ of +60° and the emission chromaticity Cy at −60° is 0.0101 for the light-emitting device 1 of FIG. 6A, 0.0075 for that of FIG. 6B, and 0.0051 for that of FIG. 6C.

In the light-emitting devices 1 of FIGS. 5A to 5C and 6A to 6C, a group of blue LED chips was used as the light-emitting elements 10 and $Y_3Al_5O_{12}:Ce$ was used as the phosphor 12.

The light distribution of the LED chip group A is narrower than that from the LED chip group B. Therefore, among the light-emitting devices 1 of FIGS. 5A to 5C and 6A to 6C, the emission angle dependence of the emission chromaticity Cy is the highest in the light-emitting device 1 of FIG. 5A and the lowest in the light-emitting device 1 of FIG. 6C.

Although the graphs in FIGS. 5A to 5C and 6A to 6C are the examples showing the emission angle dependence of emission chromaticity along the y-direction, the emission angle dependence of emission chromaticity along any direction within a horizontal plane other than the y-direction (e.g., along the x-direction) also shows the same tendency. That is, the emission angle dependence of the emission chromaticity Cy along a direction can be increased by combining the light-emitting element 10 providing a narrow distribution of light along such a direction with a small degree of settling of the phosphor 12, and the emission angle dependence of the emission chromaticity Cy along such a direction can be decreased by combining the light-emitting element 10 providing a wide distribution of light along such a direction with a large degree of settling of the phosphor 12.

Figure 7A:
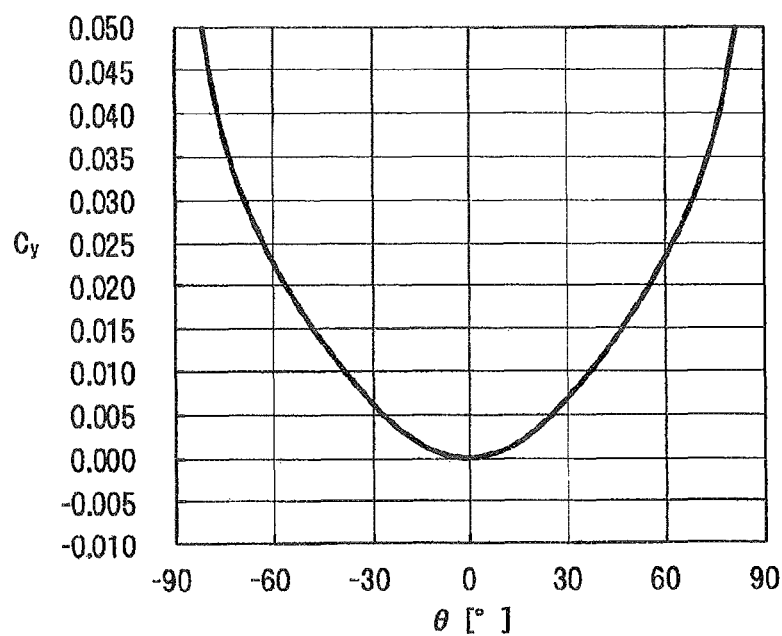
FIGS. 7A and 7B are graphs showing a relation between the emission chromaticity Cy and the emission angle θ along the y-direction of the light-emitting devices when a green phosphor $(Si,Al)_6(O,N)_8$:Eu and a red phosphor $K_2SiF_6$:Mn are used as the phosphor.
Figure 7B:
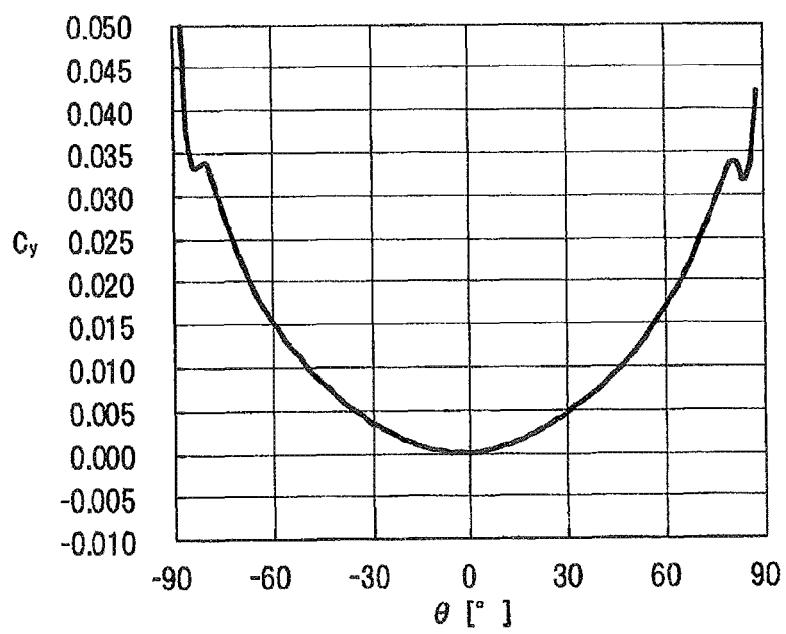

FIGS. 7A and 7B are graphs showing a relation between the emission chromaticity Cy and the emission angle θ along the y-direction of the light-emitting devices 1 when a group of blue LED chips is used as the light-emitting elements 10 and a green phosphor $(Si,Al)_6(O,N)_8:Eu$ and a red phosphor $K_2SiF_6:Mn$ are used as the phosphor 12.

The light-emitting devices 1 of FIGS. 7A and 7B respectively have the degrees of settling of the phosphor 12 shown in FIGS. 4A and 4B.

The average of the emission chromaticity Cy at the emission angle θ of +60° and the emission chromaticity Cy at −60° is 0.023 for the light-emitting device 1 of FIG. 7A, and 0.016 for that of FIG. 7B.

As such, even when $(Si,Al)_6(O,N)_8:Eu$ and $K_2SiF_6:Mn$ are used as the phosphor 12, the emission angle dependence of the emission chromaticity Cy decreases with increase in the degree of settling of the phosphor 12.

Effects of the Embodiment

In the embodiment, it is possible to control the emission angle dependence of emission chromaticity of the light-emitting device 1 in a wide range by changing the two conditions; the light distribution of the light-emitting element 10 and the degree of settling of the phosphor 12 in the sealing material 11.

Although the embodiment of the invention has been described above, the invention is not intended to be limited to the embodiment and the various kinds of modifications can be implemented without departing from the gist of the invention.

In addition, the invention according to claims is not to be limited to the embodiment. Further, please note that all combinations of the features described in the embodiment are not necessary to solve the problem of the invention.

What is claimed is:

1. A method of manufacturing a light-emitting device, the method comprising:
   measuring a light distribution of an LED chip;
   sealing the measured LED chip by a sealing material including a phosphor;
   curing the sealing material by a heat treatment,
       wherein an emission angle dependence of emission chromaticity of the light-emitting device comprising the sealed LED chip is controlled by setting a degree of settling of the phosphor in the sealing material according to the measured light distribution of the LED chip;
   before the measuring the light distribution, placing the LED chip in a case; and
   placing another LED chip in the case,
   wherein, in the sealing, the sealing material seals a recess between the LED chip and said another LED chip.

2. The method according to claim 1, wherein the degree of settling of the phosphor is controlled by changing conditions of the heat treatment.

3. The method according to claim 1, wherein the phosphor comprises a plurality of types of phosphors.

4. A method of manufacturing a light-emitting device, the method comprising:
   measuring a light distribution of an LED chip;
   sealing the measured LED chip by a sealing material including a phosphor; and
   curing the sealing material by a heat treatment,
       wherein an emission angle dependence of emission chromaticity of the light-emitting device comprising the sealed LED chip is controlled by setting a degree of settling of the phosphor in the sealing material according to the measured light distribution of the LED chip,
   wherein the LED chip comprises a plurality of LED chips,
   wherein, in the measuring, a light distribution of the plurality of LED chip is measured, and
   wherein, in the sealing, an entire quantity of the measured LED chips is sealed by the sealing material.

5. The method according to claim 4, wherein the emission angle dependence of emission chromaticity of the light-emitting device is controlled by setting the degree of settling of the phosphor in the sealing material according to the measured light distribution of the LED chips.

6. The method according to claim 5, wherein the plurality of LED chips is located in a single device that includes the light-emitting device.

* * * * *